US011808800B2

(12) United States Patent
Tilles (10) Patent No.: US 11,808,800 B2
(45) Date of Patent: Nov. 7, 2023

(54) RADIOIMAGING FOR REAL-TIME TRACKING OF HIGH-VOLTAGE BREAKDOWN

(71) Applicant: National Technology & Engineering Solutions of Sandia, LLC, Albuquerque, NM (US)

(72) Inventor: Julia Napolin Tilles, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 0 days.

(21) Appl. No.: 17/990,405

(22) Filed: Nov. 18, 2022

(65) Prior Publication Data

US 2023/0152362 A1 May 18, 2023

Related U.S. Application Data

(60) Provisional application No. 63/280,811, filed on Nov. 18, 2021.

(51) Int. Cl.
*H01H 31/12* (2006.01)
*G01R 31/12* (2020.01)
*G01R 29/12* (2006.01)

(52) U.S. Cl.
CPC ......... *G01R 31/1218* (2013.01); *G01R 29/12* (2013.01)

(58) Field of Classification Search
CPC ............... G01R 31/14; G01R 31/1209; G01R 31/1218; G01R 31/1227; G01R 31/1272; G01R 31/1245; G01R 31/1254; G01R 31/1263; G01R 31/081; G01R 31/083;
(Continued)

(56) References Cited

U.S. PATENT DOCUMENTS 5,530,366 A * 6/1996 Nasrallah ............. H02H 1/0023
324/726
6,340,890 B1 * 1/2002 Bengtsson ......... G01R 31/1209
324/536

(Continued)

OTHER PUBLICATIONS

Tilles, J. N. "Lightning Observations with the Long Wavelength Array in Sevilleta, New Mexico (LWA-SV)," 2020, SAND2020-13115C, Sandia National Laboratories, Albuquerque, NM.
(Continued)

*Primary Examiner* — Thang X Le
(74) *Attorney, Agent, or Firm* — Kevin W. Bieg (57) ABSTRACT

An interferometric radioimager provides real-time, high-fidelity radioimaging of high voltage breakdown (HVB) both internal and external to electrical components at sub-nanosecond and sub-millimeter resolution and has an ability to resolve multiple/spatially-extensive HVB simultaneously. Therefore, radioimaging can be used to screen for early life weakness/failure and enable non-destructive screening of defective electrical components. In particular, radioimaging can detect precursors to catastrophic HVB, allowing for early detection of weakness in critical electrical components. Radioimaging can also be used to track HVB and pinpoint defects in electrical components real time, including transformers, capacitors, cables, switches, and microelectronics.

6 Claims, 11 Drawing Sheets

(58) Field of Classification Search
CPC ........ G01R 31/52; G01R 31/58; G01R 31/62; G01R 29/12; G01R 29/0885
See application file for complete search history.

(56) References Cited

U.S. PATENT DOCUMENTS

| | | | | |
|---|---|---|---|---|
| 6,753,499 | B1* | 6/2004 | Yasaka | H01J 37/34 |
| | | | | 374/117 |
| 9,766,283 | B2* | 9/2017 | Han | G01N 29/07 |
| 11,486,919 | B2* | 11/2022 | Karin | G01R 31/1227 |
| 2022/0128614 | A1* | 4/2022 | Yamada | G01R 31/1272 |

OTHER PUBLICATIONS

Doma, R. S. and Azzemuddin, S., "Time Domain Measurements of High Electric Fields Due to Spark Gap Resonator," Review of Scientific Instruments, 2020, vol. 91, 074703.

Thomas, R. J. et al., "Accuracy of the Lightning Mapping Array," Journal of Geophysical Research, 2004, vol. 109, D14207.

Stock, M. G. et al., "Continuous Broadband Digital Interferometry of Lightning Using a Generalized Cross-Correlation Algorithm," Journal of Geophysical Research: Atmospheres, 2014, vol. 119, pp. 3134-3165.

Cummins, K. L. and Murphy, M. J., "An Overview of Lightning Locating Systems: History, Techniques, and Data Uses, With an In-Depth Look at the U.S. NLDN," IEEE Transactions on Electromagnetic Compatibility, 2009, vol. 51, pp. 499-518.

Yaacob, M. M. et al., "Review on Partial Discharge Detection Techniques Related to High Voltage Power Equipment Using Different Sensors," Photonic Sensors, 2014, vol. 4, pp. 325-337.

Dukanac, D., "Application of UHF Method for Partial Discharge Source Location in Power Transformers," IEEE Transactions on Dielectric and Electrical Insulation, 2016, vol. 25, pp. 2266-2278.

Roslizan, N. D. et al., "A Review: Partial Discharge Detection using UHF Sensor on High Voltage Equipment," Journal of Physics: Conference Series, 2020, vol. 1432, 012003.

Xue, N. et al., "The Location of Partial Discharge Sources Inside Power Transformers Based on TDOA Database With UHF Sensors," IEEE Access, 2019, vol. 7, 146732.

Tilles, J. N., "Broadband Radio Mapping and Imaging of Lightning Processes,", PhD Dissertation, 2020, University of New Hampshire.

* cited by examiner

RADIOIMAGING FOR REAL-TIME TRACKING OF HIGH-VOLTAGE BREAKDOWN

CROSS-REFERENCE TO RELATED APPLICATION

This application claims the benefit of U.S. Provisional Application No. 63/280,811, filed Nov. 18, 2021, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to high-voltage breakdown and, in particular, to radioimaging for real-time tracking of high-voltage breakdown.

BACKGROUND OF THE INVENTION

High-voltage breakdown (HVB; e.g., corona/sparks/arcs/streamers) is a broadband source of electromagnetic radiation generated by motions of free charges in plasma. See E. M. Bazelyan and Y. P. Raizer, *Spark Discharge*, CRC Press LLC, New York (1998). Existing diagnostics either indicate HVB of electrical components without resolving failure locations (e.g., current/voltage and/or chemical measurements), locate external HVB (e.g., high-speed optical measurements/photography), or locate both external/internal HVB but with low fidelity (e.g., a single HVB source located by UHF/acoustic emissions). See M. M. Yaacob et al., *Photonic Sens.* 4(4), 325 (2014); D. Dukanac, *IEEE Trans. Dielectr. Electr. Insul.* 25(6), 2266 (2018); N. D. Roslizan et al., *J. Phys.: Conf. Ser.* 1432, 012003 (2020); N. Xue et al., *IEEE Access* 7, 146732 (2019); F. Predl et al., "Combining Acoustic and Electrical Methods to Locate Partial Discharge in a Power Transformer," 2015 *IEEE 11th International Conference on the Properties and Applications of Dielectric Materials (ICPADM)*, July 2015; and I. Búa-Núñez et al., *IEEE Trans. Instrum. Meas.* 63(5), 1002 (2014).

SUMMARY OF THE INVENTION

The invention is directed to an interferometric radioimager for real-time radioimaging of high-voltage breakdown from a radiofrequency source, comprising an array of at least three radiofrequency sensors, wherein each pair of sensors in the array is separated by a baseline distance and wherein each baseline is oriented differently with respect to the cardinal directions, thereby providing at least three separate angles to the radiofrequency source, and wherein the at least three radiofrequency sensors can each detect a radiofrequency signal resulting from the high-voltage breakdown. The detected radiofrequency signals can be used to constitute a radioimage of the radiofrequency source. The high-voltage breakdown can comprise a precursor to a catastrophic high-voltage breakdown of an electrical component. The radiofrequency sensor can comprise a D-dot electric field sensor.

As an example of the invention, the radioimager has been used to image HVB in a 142-mm spark gap at 5 ns resolution (200 million fps) using three 100 kHz-3 GHz D-dot (dE/dt) sensors arranged in a 1-meter equilateral triangle. The radioimager has also been used to detect/image HVB in ion traps just 2 μm wide that exhibit (unwanted) HVB at low-voltage (~200V) in vacuum.

BRIEF DESCRIPTION OF THE DRAWINGS

The detailed description will refer to the following drawings, wherein like elements are referred to by like numbers.

DETAILED DESCRIPTION OF THE INVENTION

Radioimaging is based on radio interferometry, used for decades by the radio astronomy community to image distant astronomical features. See G. B. Taylor, C. L. Carilli and R. A. Perley, "Synthesis Imaging in Radio Astronomy II," *ASP Conference Series*, Vol. 180 (1999). Recently, it has been demonstrated that large astronomical radio arrays can be repurposed to radioimage nearby lightning using large networks of radiofrequency (RF) sensors. See J. N. Tilles et al., "Lightning observations with the Long Wavelength Array in Sevilleta New Mexico (LWA-SV)," SAND2020-13115C (2020); R. S. Doma and S. Azeemuddin, *Rev. Sci. Instrum.* 91, 074703 (2020); R. J. Thomas et al., *J. Geophys. Res. Atmos.* 109, D14207 (2004); M. G. Stock et al., *J. Geophys. Res. Atmos.* 119(6), 3134 (2014); and K. L. Cummins and M. J. Murphy, *IEEE Trans. Electromagn. Compat.* 51(3), 499 (2009). Radioimaging can be adapted to laboratory scales, as described herein.

Lightning/HVB generally has a complex geometry with many simultaneously-radiating sources. Therefore, propagation of HVB can only be realistically reconstructed using high-fidelity imaging akin to optical photography. However, optical signals can be strongly attenuated by the surroundings—optical signals from lightning are strongly scattered by cloud particles; in the lab, optical light might be scattered/absorbed by a dielectric casing. Radioimaging can be transparent in these environments.

Radioimaging is sensitive to any RF-emitting process. The present invention is directed to an interferometric radioimager that provides real-time, high-fidelity radioimaging of HVB both internal and external to electrical components at sub-nanosecond and sub-millimeter resolution and has an ability to resolve multiple/spatially-extensive HVB simultaneously. Therefore, radioimaging can be used to screen for early life weakness/failure and enable non-destructive screening of defective electrical components. In particular, radioimaging can detect precursors to catastrophic HVB, allowing for early detection of weakness in critical components, a capability not available using existing diagnostics (current/voltage/optical/UHF/acoustic). Radioimaging can be used to track HVB and pinpoint defects in electrical components real time, including transformers, capacitors, cables, switches, and microelectronics in communications, and navigation. Radioimaging also has application to basic plasma and HVB research, providing critical input to computational modeling endeavors striving to understand the breakdown physics for component design.

The limiting signal-to-noise ratio (SNR) needs to be understood to optimize radioimaging for high-fidelity, multi-source HVB detection. An interferometer has an angular resolution related to its overall aperture size. From classical diffraction theory, the radioimager angular resolution is a function of sensor spacing (d) and bandwidth ($\lambda$):

$$\Delta\theta \approx \lambda/d \tag{1}$$

See M. Stock, "Broadband interferometry of lightning," PhD Dissertation, New Mexico Tech (2014). Thus, temporal/spatial resolution can be refined by placing sensors farther apart and/or using higher-frequency sensors. While existing literature focuses primarily on 30 kHz-300 MHz (UHF) HVB emissions, recent results from lab-based discharges suggest strong emissions in excess of 3 GHz. See N. D. Roslizan et al., *J. Phys.: Conf. Ser.* 1432, 012003 (2020); and J. N. Tilles et al., "Ultra-wideband (>1 GHz) electromagnetic measurements of lab-based discharges and comparisons with lightning," SAND2020-13116C (2020).

Figure 1:
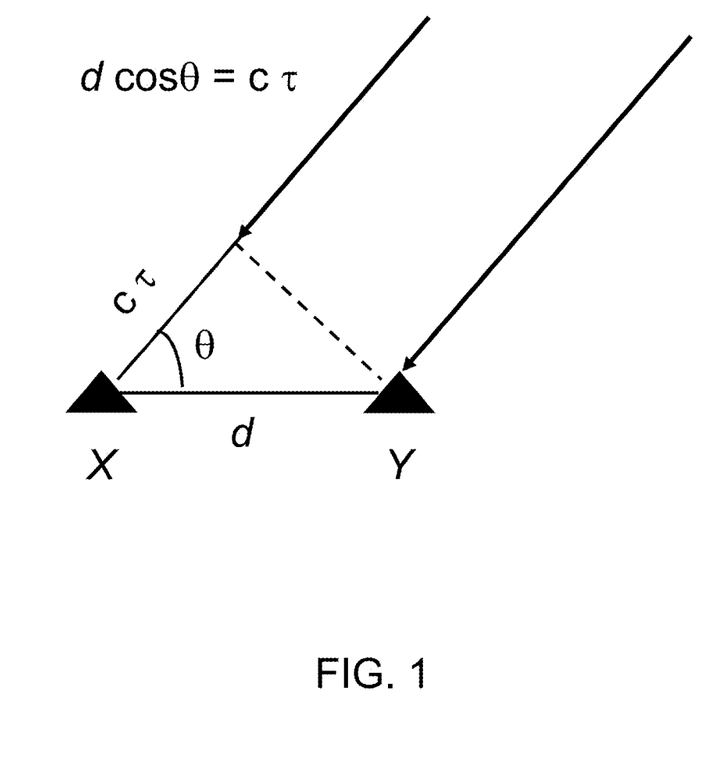
FIG. 1 is an interferometry conceptual diagram.

Radioimaging relies on the cross-correlation between radio signals arriving at a sensor network. Radio interferometry requires the coherent measurement of an RF signal by at least three sensors separated some distance. Cross-correlation of sensor data can be utilized to create sub-nanosecond/sub-millimeter resolution radioimages of HVB. The basic concept of interferometry can be explained using two sensors or antennas as an illustration, as shown in FIG. 1. It is assumed that a source is radiating a distance much farther away than the separation distance, so that the incoming electromagnetic signal can be approximated as a plane wave. RF signals can be synchronously digitized so that the time delays between the arriving signals can be readily determined, revealing the location of the RF source. For instance, every two sensors X and Y constitutes a "baseline." If the relevant time delay, $\tau$, is known, then the incident angle, $\theta$, with respect to the baseline XY is given by:

$$\theta = \arccos(c^*\tau/d) \tag{2}$$

where d is the baseline length, c is the speed of light, and arcos is inverse cosine. Since d and c are knowns, it is only necessary to find the time delay $\tau$ between the two incoming signals in order to solve for $\theta$. With just one baseline, only one angle to the source can be determined, which alone cannot give a direction to the source. By determining two different incident angles with respect to two different baselines, a direction to the RF source can be determined, providing a two-dimensional (2-D) location of the source. Adding a third antenna brings the total number of baselines from one to three, and each baseline is oriented differently with respect to the cardinal directions (north-south and east-west), providing three angles to the source. The time-differences-of-arrival for the three sensor pairs constrain the source to lie along three straight lines in the cosine plane, where each line is oriented perpendicular to its respective baseline, and the source location corresponds to the intersection of the lines.

However, determining a single angle $\theta$ for each baseline based on a single time delay $\tau$ only works if the emitting source is a point source and the emission is prompt. For instance, time delay can be found by using a cross-correlation function, where for each baseline XY the two arriving signals $f_X$ and $f_Y$ are cross-correlated. The cross correlation between the two signals arriving at sensors X and Y is a function of the time delay $\tau$:

$$(f_X^* f_Y)(\tau) = \int f_X^*(t) f_Y(t+\tau) dt \tag{3}$$

where * denotes the complex conjugate, and t denotes time. The cross-correlation provides a likelihood/probability distribution of $\tau$. The uncertainty of the time delay governs the angular uncertainty of the interferometer. In the case of a point-like prompt source, the cross-correlation is a maximum at a value of $\tau$ that can be used in equation (2) to find direction to the source. But, for two or more RF sources or extended sources, a maximum in the cross-correlation will at-best indicate only the brightest RF source, or at-worst will indicate a totally erroneous/weighted location. This is basically the current state-of-the-art using UHF/acoustic emissions, i.e., assuming a single point of HVB. See M. M. Yaacob et al., *Photonic Sens.* 4(4), 325 (2014); D. Dukanac, *IEEE Trans. Dielectr. Electr. Insul.* 25(6), 2266 (2018); N. D. Roslizan et al., *J. Phys.: Conf. Ser.* 1432, 012003 (2020); and N. Xue et al., *IEEE Access* 7, 146732 (2019).

In reality, there is a near-continuum (based on sensor digitization rate) of "available" time delays between −d/c and +d/c, where d/c is the maximum light time-of-flight from sensor X to Y. Seeing that equation (3) is a probability distribution of $\tau$, a probability amplitude can be assigned to every $\theta$, which is a function of $\tau$, in each baseline. Using straightforward geometry, the corresponding amplitudes from all baselines can be added up in a "sky plane" akin to a photograph taken with a fish-eye lens. See J. N. Tilles, *Broadband radio mapping and imaging of lightning processes*, PhD dissertation, University of New Hampshire (2020). This forms a radioimage. Note that the distributions from different baselines will constructively interfere to form a radioimage of the source, and where there is no source the distributions interfere destructively. Additional coherent measurements can selectively increase the SNR of breakdown regions and image multiple/spatially-distributed HVB events simultaneously. See J. N. Tilles et al., "Lightning observations with the Long Wavelength Array in Sevilleta New Mexico (LWA-SV)," SAND2020-13115C (2020). Thus, having a greater number of sensors (and hence a greater number of baselines) increases the SNR of the resulting radioimages. Therefore, radioimaging is scalable—the resolution and SNR are determined by sensor bandwidth, spacing, and the number of sensors in the array. SNR can be further increased using directional antennas. For example, a radioimager technology can comprise many individual patch antennas mounted together on a board in a permanent/known layout. Two or more such boards can be used together to create high-fidelity three-dimensional radioimages of external/internal HVB.

Figure 2A:
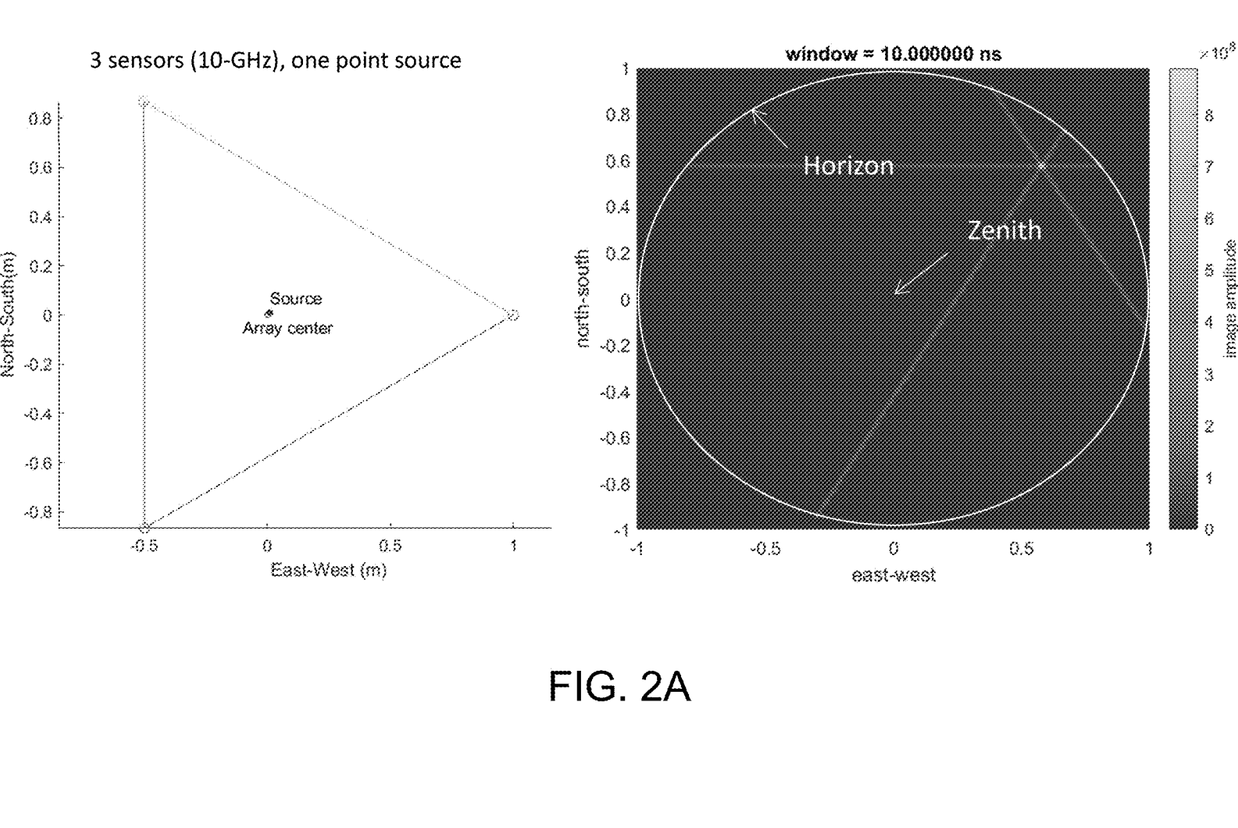
FIG. 2A is a simulated radioimage of a single point source using three sensors.
Figure 2B:
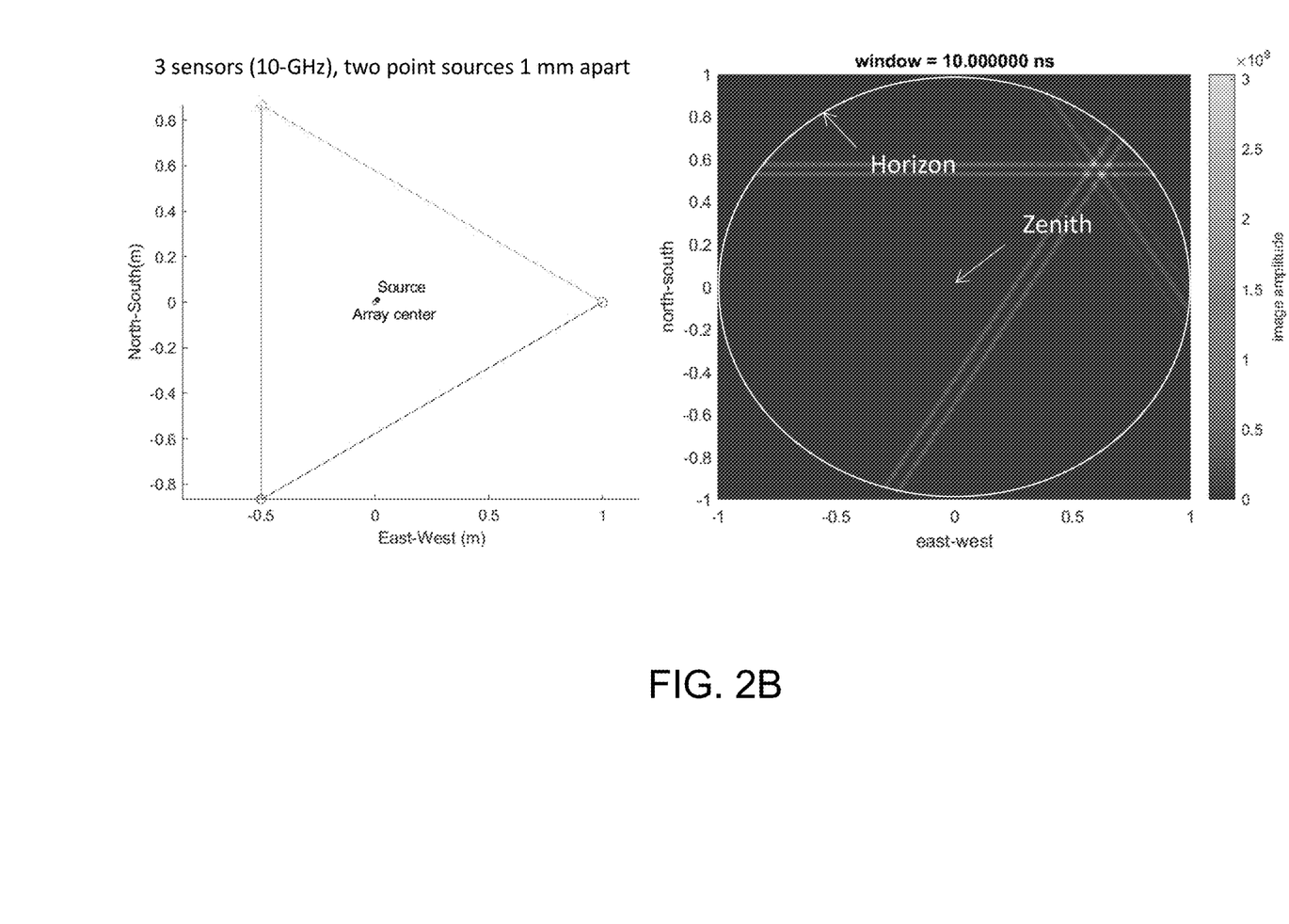
FIG. 2B is a simulated radioimage of two point sources using three sensors.
Figure 2C:
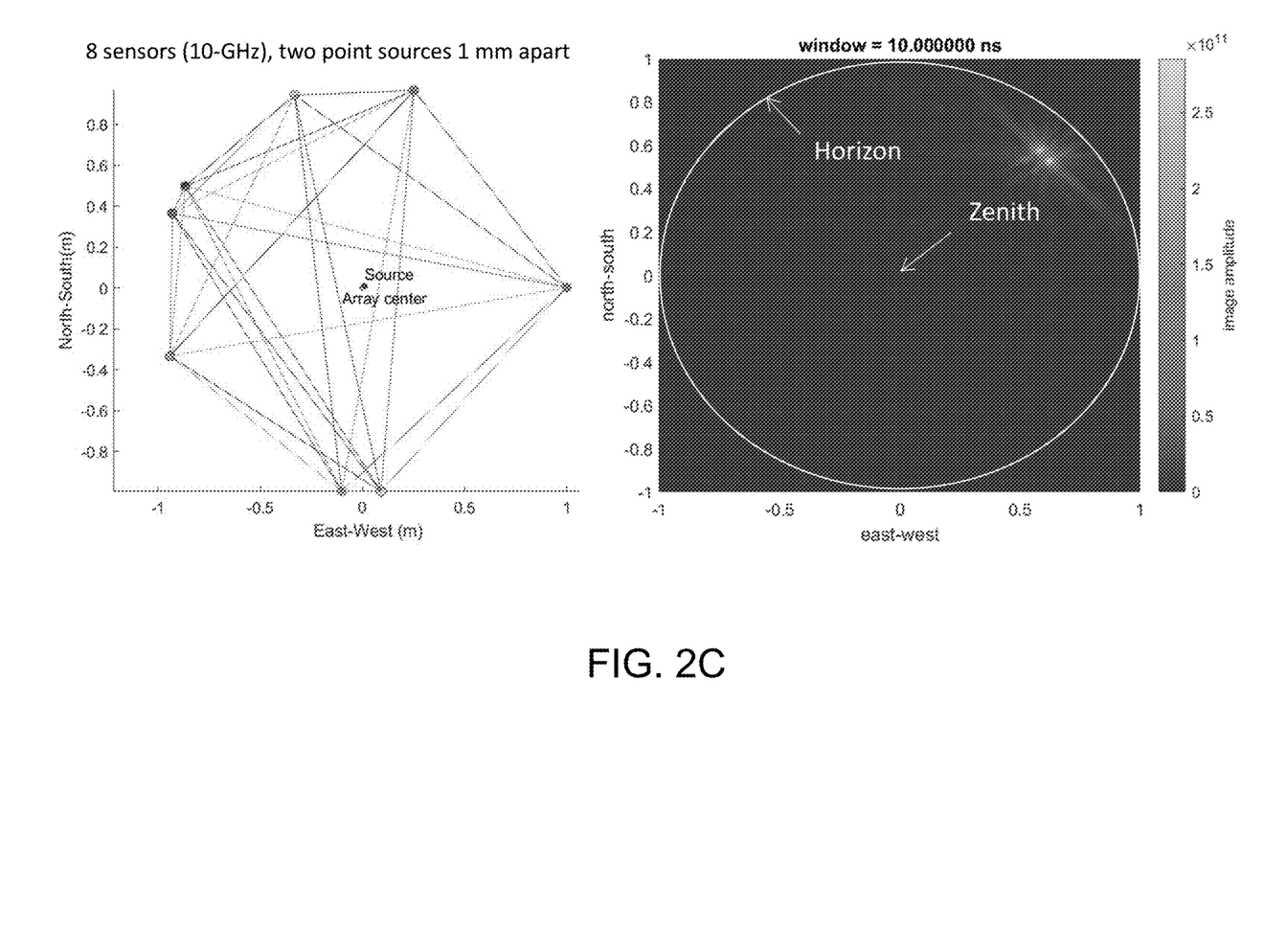
FIG. 2C is a simulated radioimage of two point sources using eight sensors.

FIG. 2A shows a simulated radioimage of a single point source using three 10-GHz bandwidth sensors on three 1.7 meter baselines. Each baseline or sensor pair provides a measurement from which the radioimage is constituted. FIG. 2B shows a simulated radioimage using the same three sensors, but of two point sources spaced 1 mm apart. Note that the simulated image using just three sensors does not accurately represent the 2-D locations of the two point sources. FIG. 2C shows a simulated radioimage of the same two point sources, but now using eight sensors arranged within a similar array diameter as before. There is a 10×SNR increase for each baseline (sensor pair) added. These simulations indicate that mm resolution is achievable using just eight 10-GHz sensors.

Regarding radioimaging of HVB within dielectric material, a simple RF computational model of HVB, e.g., a transmission line with an injected current pulse, can simulate RF signals that can then be propagated through modeled dielectric media/interfaces and into air to simulated RF sensors. Using such a model, the impacts to radioimaging can be determined and compared with a representative experiment (e.g., a current pulse through a straight wire). Radioimaging HVB internal to dielectric components may require corrections to the simple equations governing radioimaging in air alone, such as corrections to the speed of light. A simple model of HVB assumes many small asynchronous plasma filaments/branches radiating RF, where each branch is modeled as a radiating line antenna. It has been shown that such modeled composite systems can reliably reproduce the observed RF spectrum of streamer-based lightning-initiating HVB. See N. Liu et al., *Phys. Rev. Lett.* 125, 025101 (2020). This model can consequently be used as a starting point for modeling lab-based HVB. More sophisticated models of HVB—to include the plasma discharge physics—can be used.

Figure 3:
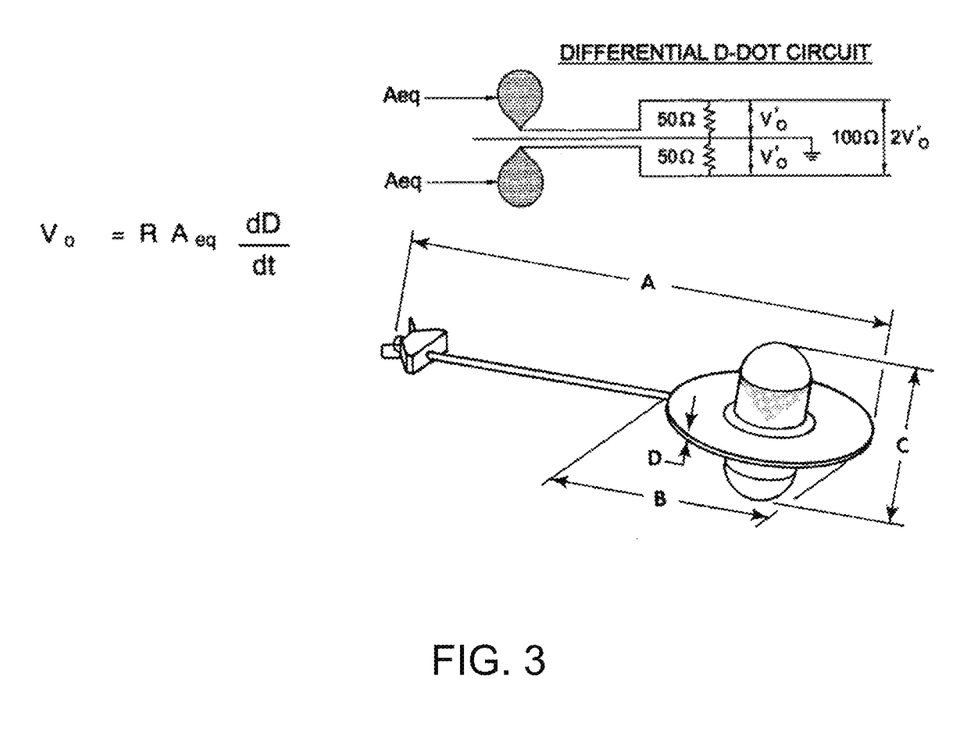
FIG. 3 is a schematic illustration of a free space D-dot electric field sensor.

For imaging lab-based discharges, the radioimager can use free space D-dot electric field sensors, as shown in FIG. 3. Such D-dot sensors are available from Prodyn Technologies. See https://www.prodyntech.com/home-page/products/d-dots-electric-field-sensors/field (D-dot). D-dot electric field sensors are small to medium-sized, high frequency sensors that measure the rate of change over time in electric displacement. Being differential, they have two asymptotic sensing elements accurately positioned on opposite sides of a common ground plate and have a radial output direction. The sensors are passive devices; therefore, an external power source is not required. D-dots can provide a calibrated measurement of the electric fields radiated by HVB. The calibrated signals can be compared to modeling results. The calibrated signals can then be used to determine current magnitude and breakdown/charge-carrier polarity by comparing with relevant physical models of the discharge. However, calibrated sensors are relatively expensive and are not strictly necessary for radioimaging.

Figure 4:
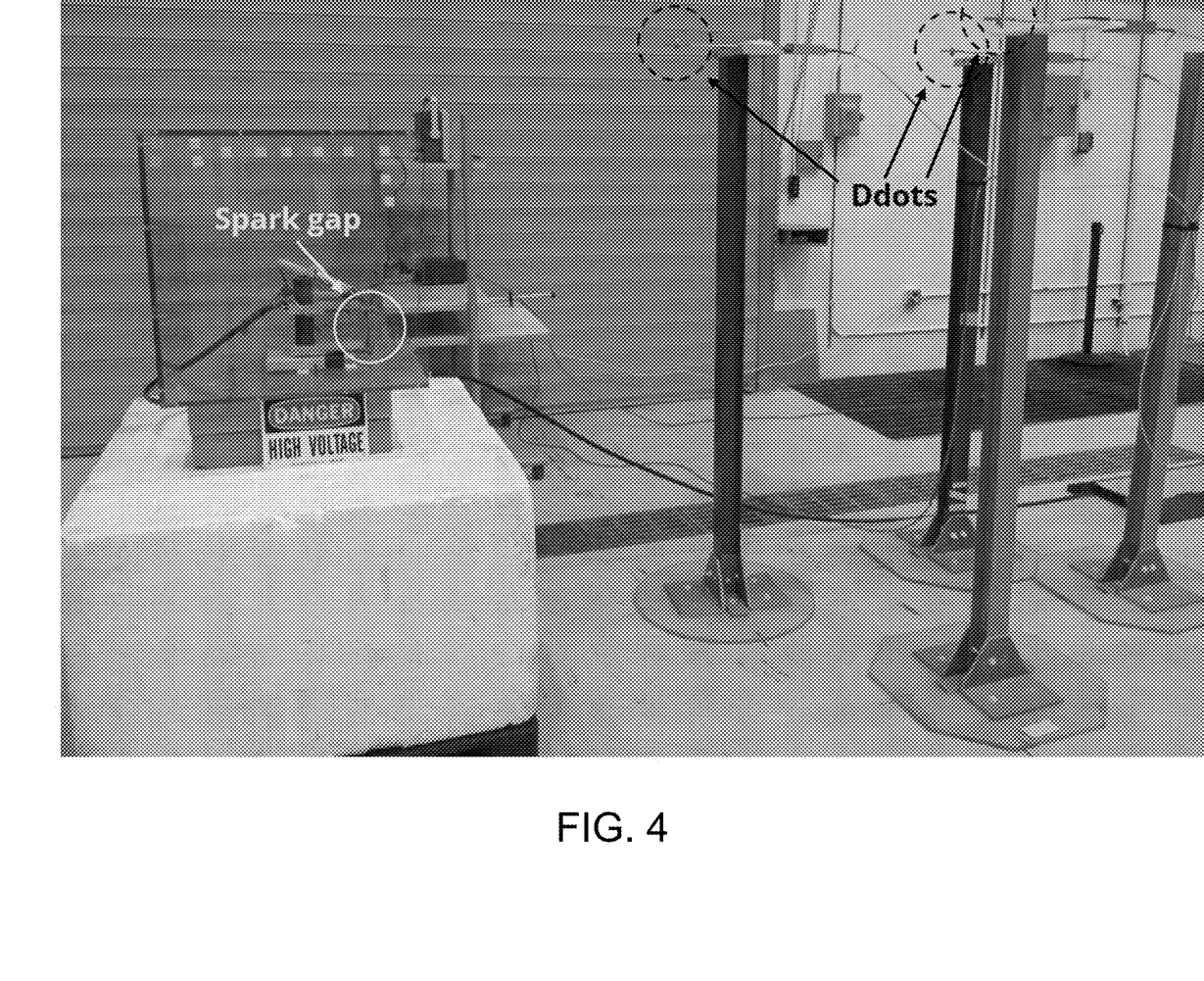
FIG. 4 is a photograph of a system for radioimaging of a 142-mm spark gap at 90-kV using three 3-GHz D-dot sensors arranged in a 1-meter triangle.
Figure 5A:
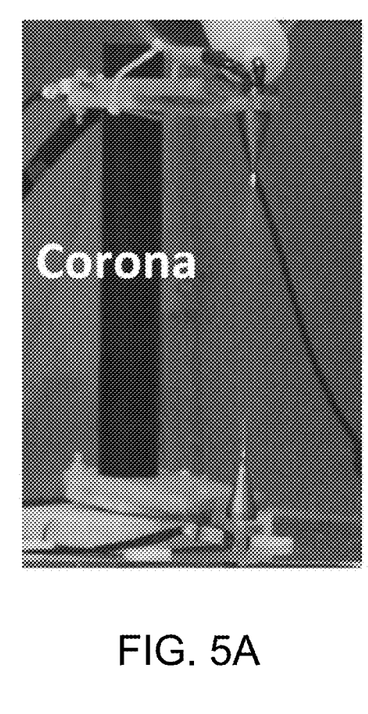
FIGS. 5A and 5B are photographs showing two different HVB regimes—corona and arc discharge—during voltage ramp-up to 90 kV at 10 kV/s of the system shown in FIG. 4.
Figure 5B:
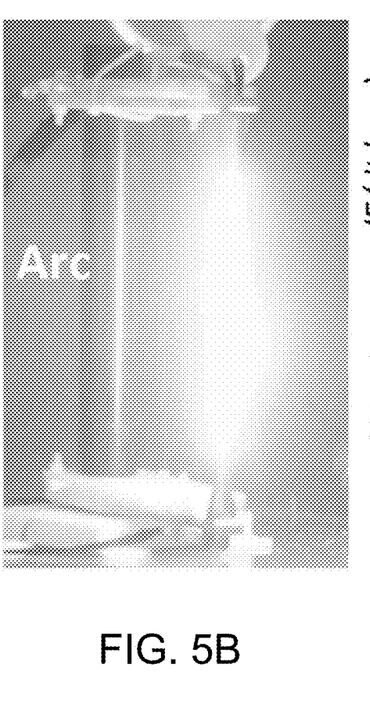
Figure 5C:
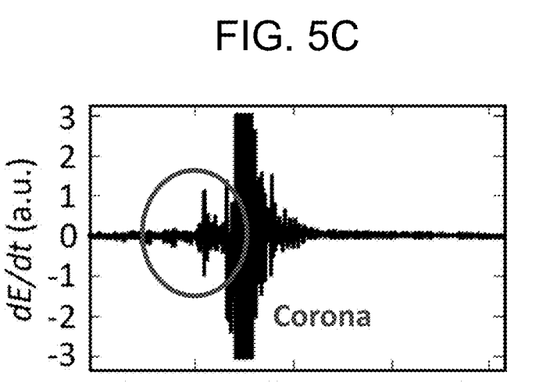
FIG. 5C shows the time-domain electric field time derivative in arbitrary units.
Figure 5D:
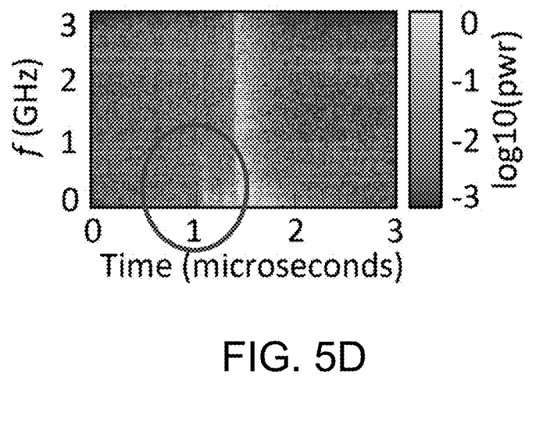
FIG. 5D is a spectrogram as a function of time. Note the strong broadband (at least 3 GHz) signal at about 1.5 μs, as well as detectable precursor activity.
Figure 5E:
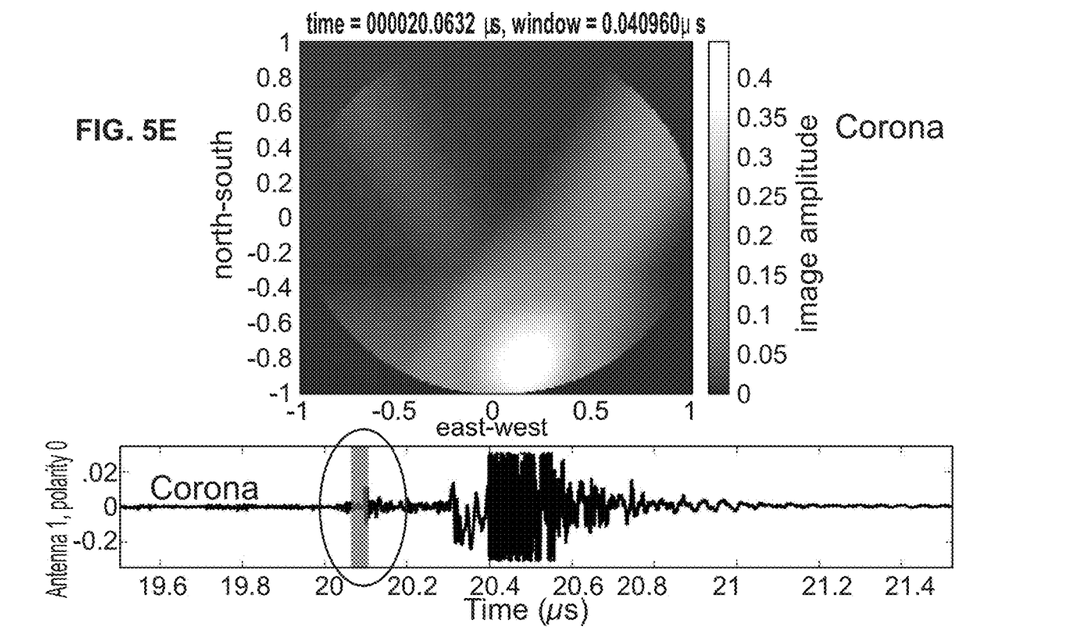
FIG. 5E is a radioimage of the corona regime.
Figure 5F:
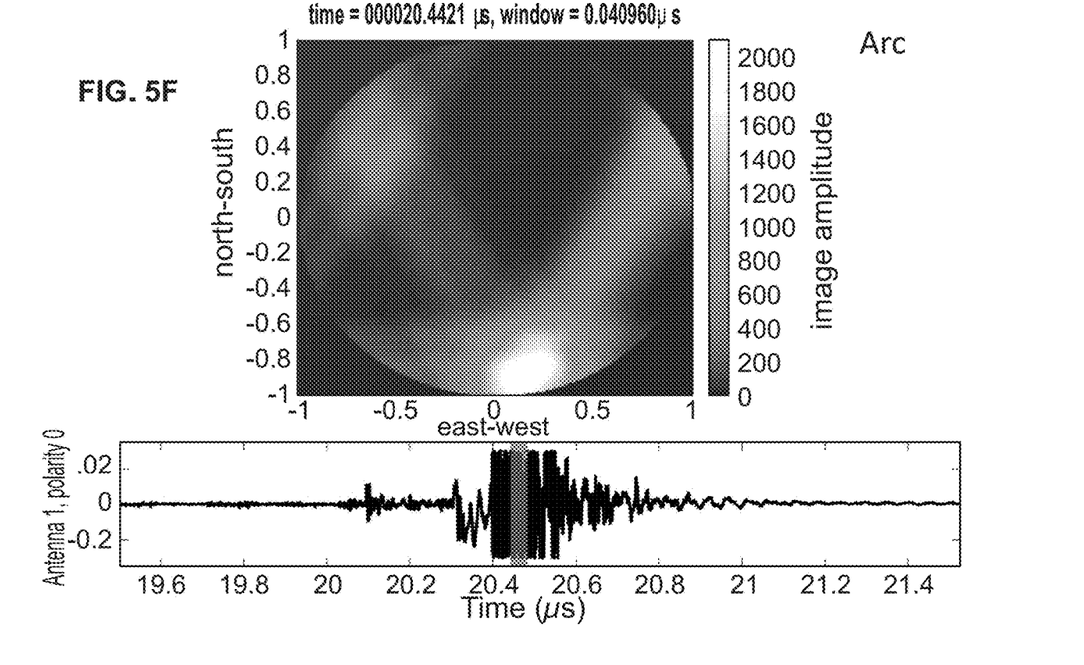
FIG. 5F is a radioimage of the arc discharge regime.

FIG. 4 shows a laboratory system for radioimaging of a 142-mm spark gap at 90-kV using three 3-GHz D-dot electric field sensors arranged in a 1-meter triangle. Radioimaging is sensitive to any RF-emitting process, including precursors (corona) to catastrophic HVB via an arc discharge. FIGS. 5A and 5B are photographs showing the two different HVB regimes—corona and arc discharge—during voltage ramp-up to 90 kV at 10 kV/s of the system shown in FIG. 4. FIG. 5C shows the time-domain electric field time derivative in arbitrary units. FIG. 5D is a spectrogram as a function of time. Note the strong broadband (at least 3 GHz) signal at about 1.5 µs, as well as detectable precursor activity. FIG. 5E is a radioimage of the corona (precursor) regime. The corona is detectable and localizable by radioimaging. FIG. 5F is a radioimage of the arc discharge regime.

To optimize radioimaging for investigating HVB at sub-millimeter/sub-nanosecond scales, understanding the RF spectra of different HVB processes—particularly, non-catastrophic corona discharge, as shown in FIG. 5D—is necessary. By understanding RF spectra of different HVB types, any dependence on operating voltage/gap-length/temperature/pressure, and/or other variables, the capabilities/limitations of radioimaging can be determined. For instance, spacing sensors farther apart to hit a target angular resolution requires prior knowledge of the SNR. Moreover, the larger bandwidth of RF spectra of HVB can be used to further optimize spatial/temporal resolution.

Figure 6:
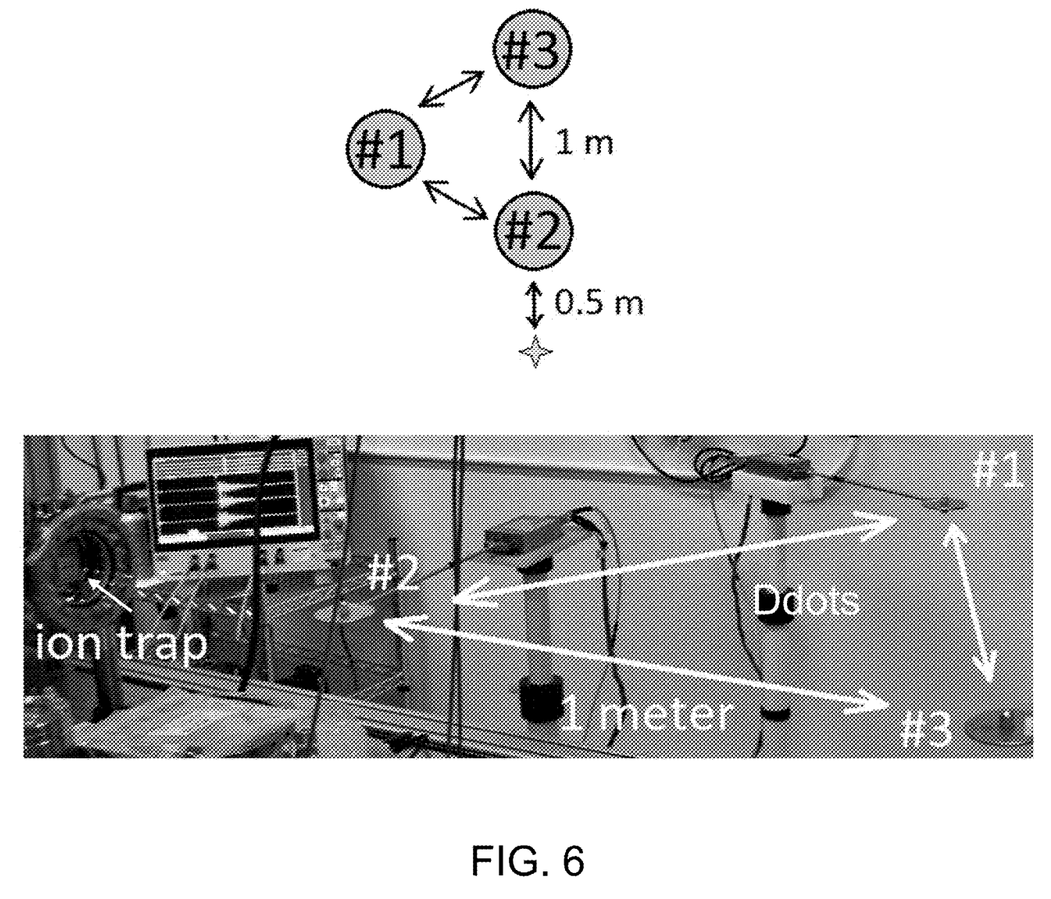
FIG. 6 is a photograph of three D-dot (RF) sensors arranged in a 1-meter equilateral triangle near an ion trap.
Figure 7:
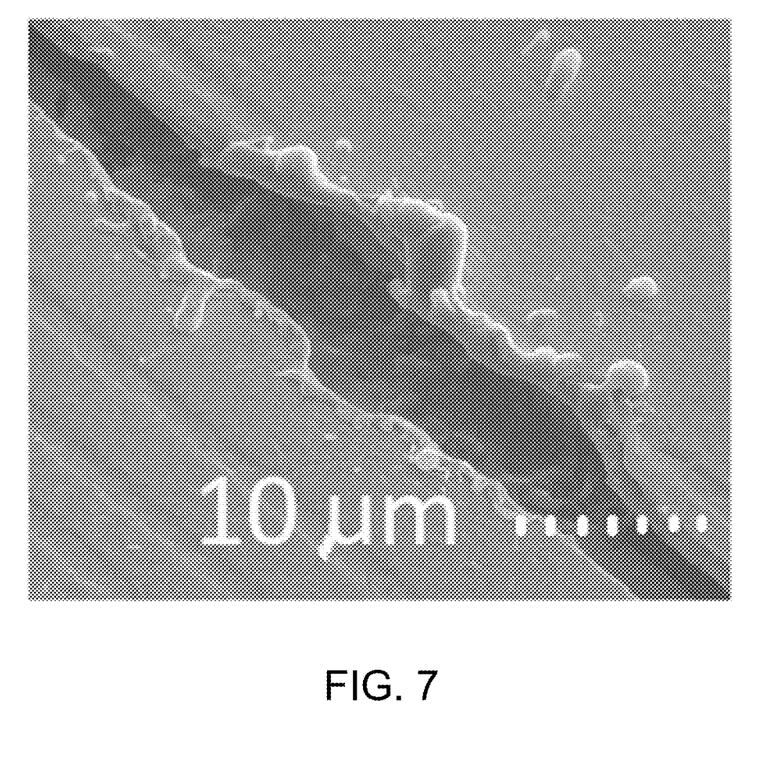
FIG. 7 is an electron microscope image of ion trap damage due to non-catastrophic HVB.
Figure 8A:
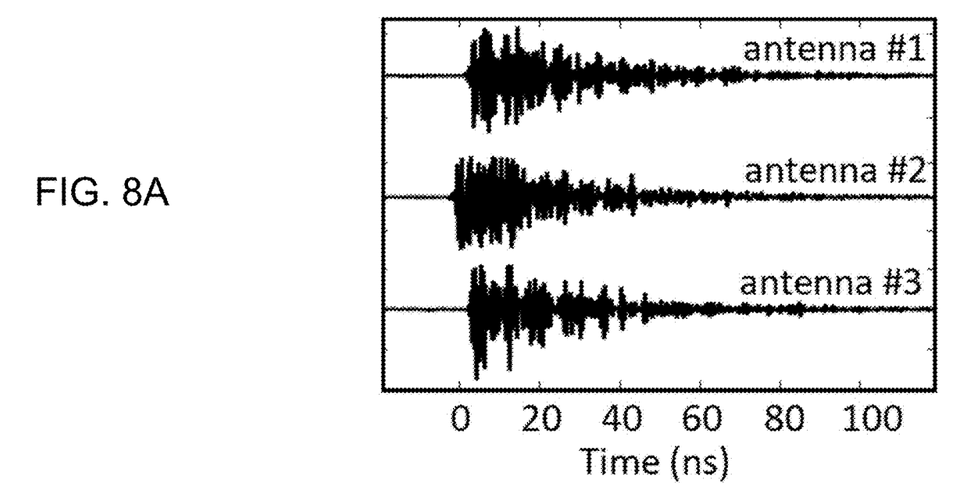
FIG. 8A shows three synchronously digitized D-dot signals—note the different arrival times at the three sensors.
Figure 8B:
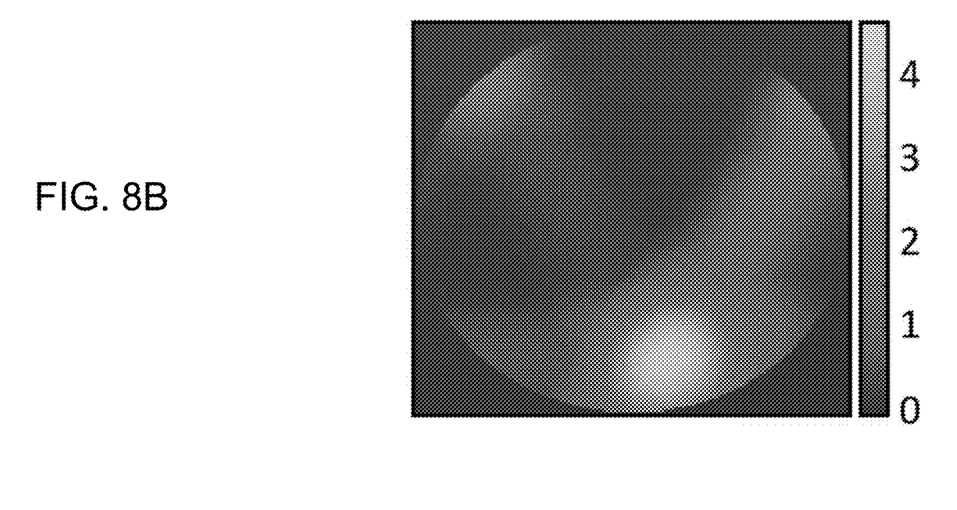
FIG. 8B is a 5-ns radioimage constructed from the time delays between the three D-dot signals. The source location is consistent with ion trap location, indicating HVB in the trap.

The radioimager can also be used for the characterization of HVB in highly controlled environments, such as ion traps used for quantum computing, where pressure/voltage/gap geometry are known to fine scales typically unavailable in traditional high-voltage testbeds. FIG. 6 shows a test setup for detecting HVB in an ion trap comprising a 3-µm gap under vacuum with 200V applied voltage. The test setup used three 3-GHz D-dot sensors arranged in a 1-meter triangle. Previously, ion traps would undergo catastrophic HVB, rendering the device shorted and useless. However, radioimaging can detect and locate HVB in gaps as small as 2 µm without permanently shorting the device and can also detect non-catastrophic breakdown resulting in damage similar to that exhibited in the electron microscope image in FIG. 7. The SEM image shows melting in the ion trap high-voltage rails due to HVB. Ion trap voltage limits can be investigated using radioimaging. FIG. 8A illustrates three time-domain signals arriving at antennas A, B, and C from the onset of an HVB. A slight temporal offset can be seen between the three similar (but not completely identical) signals. FIG. 8B is a radioimage of the HVB of the ion trap obtained from the signals. The RF characteristics of HVB as a function of ion trap gap width and applied voltage can also be investigated. Traps of various sizes and materials can be constructed specifically for the purpose of investigating the RF spectra of HVB.

The present invention has been described as a radioimaging for real time tracking of high-voltage breakdown. It will be understood that the above description is merely illustrative of the applications of the principles of the present invention, the scope of which is to be determined by the claims viewed in light of the specification. Other variants and modifications of the invention will be apparent to those of skill in the art.

I claim:

1. An interferometric radioimager for real-time radioimaging of high-voltage breakdown from a radiofrequency source, comprising:
   an array comprising at least three radiofrequency sensors, thereby providing at least three pairs of radiofrequency sensors, wherein the radiofrequency sensors in each pair are separated by a baseline distance and form a baseline, wherein each baseline is oriented differently with respect to each of the other baselines of the at least three pairs of radiofrequency sensors, thereby providing at least three separate angles to the radiofrequency source, and wherein the at least three radiofrequency sensors can each detect a radiofrequency signal resulting from the high-voltage breakdown.

2. The radioimager of claim 1, wherein the detected radiofrequency signals are used to constitute a radioimage of the radiofrequency source.

3. The radioimager of claim 1, wherein the radiofrequency source comprises an electrical component.

4. The radioimager of claim 1, wherein the high-voltage breakdown comprises a precursor to a catastrophic high-voltage breakdown.

5. The radioimager of claim 4, wherein the precursor comprises a corona discharge.

6. The radioimager of claim 1, wherein the radiofrequency sensor comprises a D-dot electric field sensor.

\* \* \* \* \*